(12) United States Patent
Ballandras et al.

(10) Patent No.: US 12,271,774 B2
(45) Date of Patent: Apr. 8, 2025

(54) COMPOSITE SUBSTRATES FOR SAW TAGS OR RFID AND SENSORS APPLICATIONS

(71) Applicant: Soitec, Bernin (FR)

(72) Inventors: Sylvain Ballandras, Besançon (FR); Thierry LaRoche, Besançon (FR)

(73) Assignee: Soitec, Bernin (FR)

( * ) Notice: Subject to any disclaimer, the term of this patent is extended or adjusted under 35 U.S.C. 154(b) by 625 days.

(21) Appl. No.: 16/980,324

(22) PCT Filed: Mar. 14, 2019

(86) PCT No.: PCT/EP2019/056428
§ 371 (c)(1),
(2) Date: Sep. 11, 2020

(87) PCT Pub. No.: WO2019/175315
PCT Pub. Date: Sep. 19, 2019

(65) Prior Publication Data
US 2021/0034935 A1 Feb. 4, 2021

(51) Int. Cl.
*H03H 9/02* (2006.01)
*G06K 19/067* (2006.01)
(Continued)

(52) U.S. Cl.
CPC .......... *G06K 19/0675* (2013.01); *H03H 3/08* (2013.01); *H03H 9/02559* (2013.01); *H03H 9/02574* (2013.01); *H03H 9/25* (2013.01)

(58) Field of Classification Search
CPC ... H03H 3/08; H03H 9/02559; H03H 9/02574
(Continued)

(56) References Cited

U.S. PATENT DOCUMENTS 6,788,204 B1 9/2004 Ianelli et al.
2004/0075361 A1 4/2004 Harmann
(Continued)

FOREIGN PATENT DOCUMENTS

CN 1943109 A 4/2007
CN 201535702 U 7/2010
(Continued)

OTHER PUBLICATIONS

International Search Report for International Application No. PCT/EP2019/056428 dated May 28, 2019, 3 pages.
(Continued)

*Primary Examiner* — Derek J Rosenau
(74) *Attorney, Agent, or Firm* — TraskBritt

(57) ABSTRACT

A surface acoustic wave tag device is disclosed, comprising: an acoustic wave propagating substrate, at least one transducer structure comprising inter-digitated comb electrodes, and at least one reflecting means, the reflecting means comprising at least one reflector, wherein the acoustic wave propagation substrate is a composite substrate comprising a base substrate and a piezoelectric layer, wherein the crystallographic orientation of the piezoelectric layer with respect to the base substrate is such that the propagation of a shear wave inside the piezoelectric layer and in the direction of propagation corresponding to the acoustic wave is enabled. A physical quantity determining device and a fabrication method of such surface acoustic wave tag device are also disclosed.

13 Claims, 9 Drawing Sheets

(51) Int. Cl.
*H03H 3/08* (2006.01)
*H03H 9/25* (2006.01)

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2004/0075560 A1 | 4/2004 | Hartmann et al. |
| 2004/0135650 A1 | 7/2004 | Miura et al. |
| 2005/0056695 A1 | 3/2005 | Hartmann et al. |
| 2005/0162048 A1 | 7/2005 | Solal et al. |
| 2006/0130585 A1* | 6/2006 | Magee ................. G01L 9/0025 73/570 |
| 2010/0237959 A1* | 9/2010 | Tanaka ............... H03H 9/02551 333/195 |
| 2016/0261248 A1* | 9/2016 | Grousset ................. H03H 9/54 |

FOREIGN PATENT DOCUMENTS

| | | |
|---|---|---|
| CN | 101877073 | 11/2010 |
| CN | 107462192 | 6/2023 |
| JP | 2002-539743 A | 11/2002 |
| JP | 2003-234634 A | 8/2003 |
| JP | 2004-343671 A | 12/2004 |
| JP | 2004-296679 | 5/2005 |
| JP | 2005-528031 A | 9/2005 |
| JP | 2006-507610 A | 3/2006 |
| JP | 2006-170864 A | 6/2006 |
| JP | 2006-268578 A | 10/2006 |
| JP | 2007-037006 A | 2/2007 |
| JP | 2007-506367 A | 3/2007 |
| JP | 48-018947 | 11/2011 |
| JP | 2017-161397 A | 9/2017 |
| WO | 2011/142380 A1 | 11/2011 |
| WO | 2013/141168 A1 | 9/2013 |
| WO | 2015/198904 A1 | 11/2015 |
| WO | 2017/008010 A1 | 1/2017 |

OTHER PUBLICATIONS

International Written Opinion for International Application No. PCT/EP2019/056428 dated May 28, 2019, 6 pages.

Japanese Office Action for Japanese Application No. 2020-547377 dated Nov. 16, 2021, 12 pages with translation.

Japanese Preliminary Report for Application No. 2020-547377 dated Apr. 19, 2023, 4 pages.

Chinese Office Action for Application No. 201980019361.1 dated Jan. 20, 2024, 12 pages.

Japanese Office Action for Application No. 2022-197349 dated Jan. 9, 2024, 7 pages.

Japanese Decision of Refusal for Refusal for Japanese Application No. 2020-547377, dated Aug. 9, 2022, 10 pages with English translation.

Japanese Notice of Reasons for Refusal for Japanese Application No. 2020-547377, dated Nov. 16, 2021, 13 pages with English translation.

Japanese Notice of Reasons for Refusal for Japanese Application No. 2020-547377, dated Nov. 21, 2023, 13 pages with English translation.

* cited by examiner

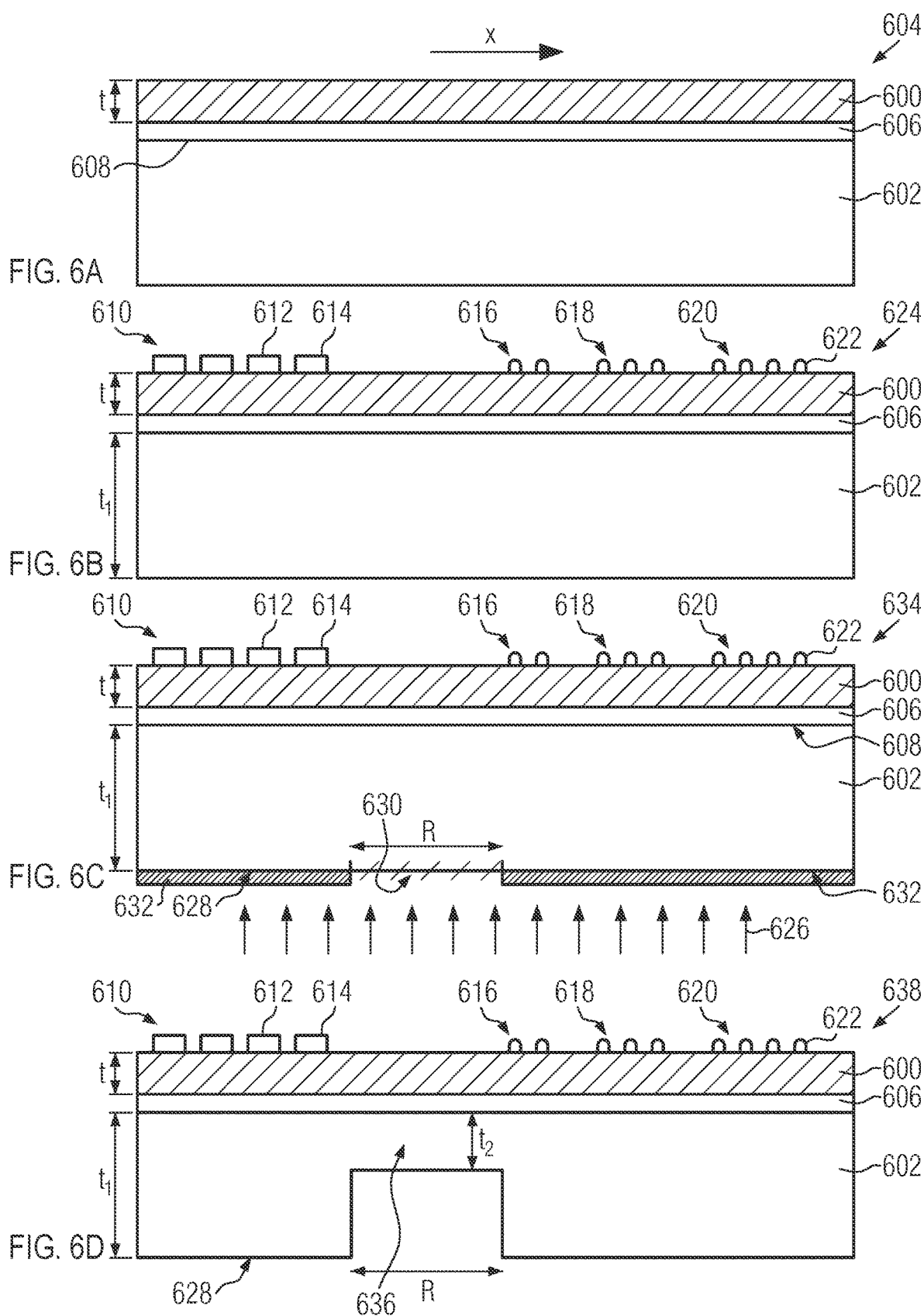

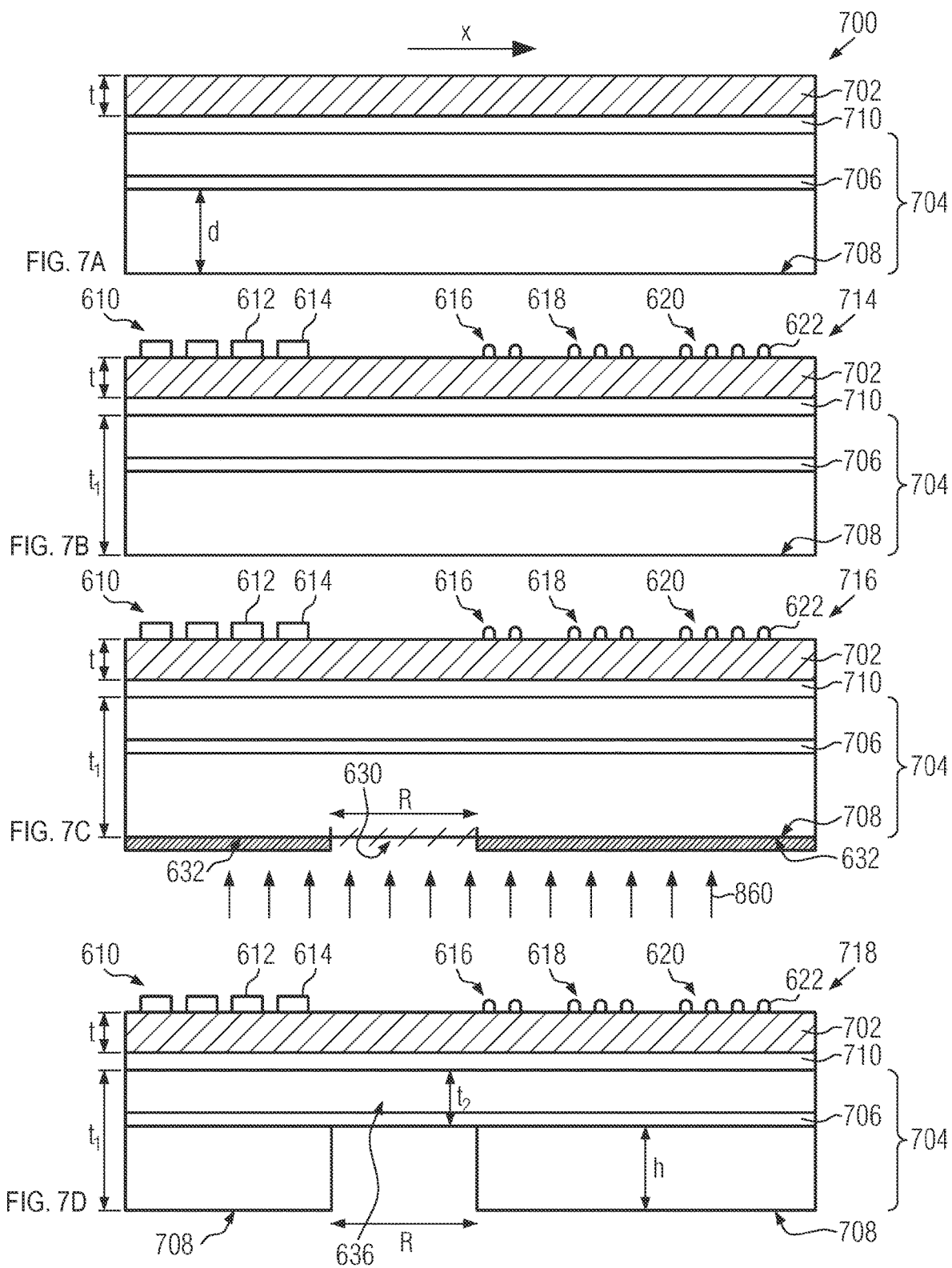

COMPOSITE SUBSTRATES FOR SAW TAGS OR RFID AND SENSORS APPLICATIONS

CROSS-REFERENCE TO RELATED APPLICATIONS

This application is a national phase entry under 35 U.S.C. § 371 of International Patent Application PCT/EP2019/056428, filed Mar. 14, 2019, designating the United States of America and published in English as International Patent Publication WO 2019/175315 A1 on Sep. 19, 2019, which claims the benefit under Article 8 of the Patent Cooperation Treaty to French Patent Application Serial No. 1852279, filed Mar. 16, 2018.

TECHNICAL FIELD

The present disclosure relates to surface acoustic wave tag devices for RFID and sensor applications and, more particularly, to a composite substrate for surface acoustic wave tag devices.

BACKGROUND

Surface acoustic wave (SAW) tag devices have been used as radio frequency identification device (RFID) tags since the late 1980s. According to the state of the art, a SAW tag device comprises a piezoelectric substrate with a single transducer and a set of reflectors, positioned at various delays on one side of the transducer, as well as an antenna. An incident RF signal is captured by the antenna attached to the SAW tag, which activates the SAW tag and is re-transmitted as the reflected response of the SAW tag device.

The figures of merit to consider for the design of this kind of device is the electromechanical coupling coefficient $k_s^2$, the temperature stability of the frequency of operation, and the reflection coefficient of the reflectors at the Bragg condition.

SAW tag devices rely on the use of Rayleigh waves travelling on the surface of bulk piezoelectric Lithium Niobate (LiNbOa) in a crystalline orientation given by (YX/)/128°. With an electromechanical coupling coefficient $k_s^2$ of between 5 and 6%, this configuration makes it possible to produce SAW tags operating in a frequency band centered at 2.45 GHz that can be remotely interrogated at distances of a few cm to several meters.

But the use of the Rayleigh wave in bulk Lithium Niobate does not make it possible to obtain an electromechanical coupling coefficient $k_s^2$ greater than 6%, thus limiting the distance at which the device can be interrogated.

Furthermore, Lithium Niobate actually exhibits a strong drift in temperature, of about 70 ppm/K minimum for the temperature coefficient of the delay (TCD), which makes it difficult to realize an architecture that can be used as a sensor for measuring any other physical parameter but temperature.

BRIEF SUMMARY

The object of the present disclosure is to overcome the drawbacks cited previously by providing a surface acoustic wave (SAW) tag device deposited on a composite substrate with improved performance for RFID and sensor applications, and, in particular, for the measurement of physical parameters other than temperature.

The object of the present disclosure is achieved by a surface acoustic wave tag device, comprising an acoustic wave propagating substrate, at least one transducer structure provided over the substrate comprising inter-digitated comb electrodes, and at least one reflecting means, the reflecting means comprising at least one reflector positioned at a distance with respect to the at least one transducer structure in the direction of propagation of an acoustic wave, characterized in that the acoustic wave propagation substrate is a composite substrate comprising a base substrate and a piezoelectric layer, wherein the crystallographic orientation of the piezoelectric layer with respect to the base substrate is such that the propagation of a shear wave inside the piezoelectric layer and in the propagation direction corresponding to the acoustic wave is enabled.

In such device, due to the relative crystalline orientation of the piezoelectric layer with respect to the base substrate, the shear waves are the predominant waves propagating in the piezoelectric layer and not the Rayleigh waves like in the state of the art SAW tag devices. As the temperature stability of the shear wave is improved using the proposed composite substrate compared to the one of the Rayleigh waves on bulk $LiNbO_3$, it becomes possible to extend the application of SAW tag devices to the measurement of mechanical parameters, such as force, pressure, etc., in addition to the measurement of temperature. Furthermore, the shear wave modes in the considered composite substrates present a stronger electromechanical coupling coefficient $k_s^2$ compared to the Rayleigh wave modes on bulk $LiNbO_3$, and using such relative crystalline orientations of the piezoelectric layer with respect to the base substrate will also result in an increase by a factor of about 2 up to about 5 of the electromechanical coupling coefficient $k_s^2$. It will therefore be possible to obtain SAW tag devices having an increased distance for remote interrogation.

According to a variant of the present disclosure, the piezoelectric layer of the composite substrate can be Lithium Tantalate ($LiTaO_3$) or Lithium Niobate ($LiNbO_3$).

According to a variant of the present disclosure, the piezoelectric layer is Lithium Niobate $LiNbO_3$ and the crystallographic orientation of the piezoelectric layer with respect to the base substrate is (Y X/)/θ according to standard IEEE 1949 Std-176, with θ, an angle of the crystallographic orientation comprised between 0° and 100°, in particular, between 0° and 50°, or between 140° and 180°, modulo 180°. In this particular range of crystallographic orientation, the shear wave mode is travelling inside the piezoelectric layer and a fast propagation velocity of 4000 m/s or above and an absolute maximal TCF value of around 65 ppm/K as well as a $k_s^2$ value above 20% can be observed. In general, shear wave modes exhibit an electromechanical coupling factor $k_s^2$ large enough to allow for the operation of SAW-tags whereas only the cut angle close to the (YX/)/128° orientation allows for the exploitation of the Rayleigh wave in that purpose. Therefore, cut angles in the ranges [0°-100°] and [140°-180°] favor the use of shear wave modes and Rayleigh waves can be exploited using any crystal cut in the range [100°-180°].

According to a variant of the present disclosure, the piezoelectric layer is Lithium Tantalate ($LiTaO_3$) and the crystallographic orientation of the piezoelectric layer with respect to the base substrate is (Y X/)/θ according to standard IEEE 1949 Std-176, with θ, an angle of the crystallographic orientation comprised between −30° and 90°, in particular, between 0° and 90°, modulo 180°. In this particular range of crystallographic orientation, the shear wave mode is predominant over the Rayleigh mode and a fast propagation velocity of about 4000 m/s and a TCF comprised below-20 ppm/K and a $k_s^2$ value from about 3% to 12% can be observed. In particular, for a range of 0 comprised between 20° and 60°, more, in particular, for 0 of the order of 36° or of the order of 42°, modulo 180°, the TCF can be close to zero.

According to a variant of the present disclosure, the base substrate of the composite substrate is Silicon. For transferring piezoelectric layers on Silicon, mass production methods like SmartCut™, using ion implantation in a piezoelectric source substrate to define a layer to be transferred, attaching the source substrate to a Silicon substrate and transferring the layer by a thermal or mechanical treatment, can be used. As an alternative, base substrates like Diamond, Sapphire, Silicon Carbide, fused Quartz or Quartz crystal could be used. Preferably, the base substrate of the composite substrate can be a Silicon on Insulator substrate (SOI), corresponding to a layered silicon-insulator-silicon substrate and the insulating layer can be a $SiO_2$ layer.

According to a variant of the present disclosure, the base substrate can also comprise a Bragg mirror composed of alternated low/high acoustic impedance layers such as Silica and Tungsten or Silica and Silicon Nitride or Silica and Aluminum Nitride. A Bragg mirror reduces energy loss toward the base substrate as it can reflect the radiated part of the mode toward the piezoelectric layer, and can also add mechanical stability to the device structure.

According to a variant of the present disclosure, at least a part of the base substrate can be deformable. It is therefore possible to have a SAW tag device, which can measure a mechanical parameter resulting from a deformation, such as i.e., a pressure or a vibration leading to a difference in time of flight of the reflected shear wave.

According to a variant of the present disclosure, the at least one reflector of the reflecting means comprises one or more metallic strips, the metallic strips can be connected to each other or connected to ground. Connecting them as described previously results in an improvement of the reflection coefficient of the reflectors at the Bragg condition, in contrary to the state of the art situation of Rayleigh waves on monolithic (YX/)/128° LiNbO₃. An improved reflection coefficient of the reflector at the Bragg condition results in a better detection of the reflected waves by the transducer structure. It will therefore be possible to obtain SAW tag devices having an improved response signal compared to the state of the art SAW tag devices.

According to a variant of the present disclosure, a physical quantity determining device comprising two or more SAW tag devices, at least one being described as previously, can further comprise only one tag antenna connected to the transducer structures of the two or more SAW tag devices. This device can measure two or more parameters, which can be transmitted using only one antenna. Using only one antenna simplifies the structure.

According to a variant of the present disclosure, one SAW tag device of the two of more SAW tag devices comprised in the physical quantity determining device can be a surface acoustic wave resonator, and at least one of the SAW tag devices can be as described previously. In this physical quantity determining device, the SAW resonator allows the identification of a device on which a measurement of a physical parameter is to be carried out. The SAW resonator allows the identification and the at least one of the SAW tag device allows the measurement of the physical quantity, e.g., temperature or pressure.

According to a variant of the present disclosure, the surface acoustic wave resonator of the physical quantity determining device can be positioned with respect to the at least one of the surface acoustic wave tag device of the physical quantity determining device so that they have two different surface acoustic wave propagation direction. Preferably, the surface acoustic wave propagation direction of the surface acoustic wave resonator, being parallel to one of the crystalline axis of the piezoelectric layer makes an angle y with the surface acoustic wave propagation direction of the at least one of the surface acoustic wave tag device. As a result, the angle y can be chosen so that the surface acoustic wave resonator can generate the type of acoustic wave needed for the desired application for the physical quantity determining device. Both devices can use the same type of acoustic waves, both being shear waves or being Rayleigh waves or any other type of acoustic waves enabled by the orientation of the piezoelectric layer and the direction of propagation chosen.

In a variant of the present disclosure, the surface acoustic wave resonator can be configured to use Rayleigh waves and the at least one of the surface acoustic wave tag device of the physical quantity determining device can be configured to use shear waves. Thus, the surface acoustic wave resonator can do the identification and the at least one of the surface acoustic wave tag device can do the measurement.

According to a variant of the present disclosure, the physical quantity determining device is configured to measure temperature and/or pressure and/or force and/or configured to allow identification. Thus, in one SAW device it becomes possible to allow the identification of a device and to measure one or more of its physical parameters.

The object of the present disclosure is also achieved by a method for fabricating a SAW tag device, comprising the steps of a) providing a piezoelectric layer over a base substrate and b) providing a transducer structure on the piezoelectric layer, wherein in step a) the piezoelectric layer is provided such that the crystallographic orientation of the piezoelectric layer with respect to the base substrate is such that the propagation of shear waves corresponding to the acoustic waves is enabled. A layer transfer, e.g., using SmartCut™ technology can be used.

According to a variant of the present disclosure, the method of fabrication of a SAW tag device described above further comprises a step of thinning the base substrate. For example, the thinning of the base substrate can yield a seismic mass or a membrane. In this configuration, the SAW tag device can measure forces or deformations.

According to a variant of the present disclosure, the step of thinning the base substrate comprises thinning a part of the surface opposite the surface where the piezoelectric layer is attached. Thus the SAW tag device can be positioned just over the thinned part of the base substrate so that it becomes sensitive to deformation.

According to a variant of the present disclosure, the step of thinning the base substrate is done by etching, wet or dry, grinding or chemical mechanical polishing.

According to a variant of the present disclosure, the base substrate can be a semiconductor on insulator (SOI) substrate, such that the insulator layer of the semiconductor on insulator (SOI) substrate can act as an etch stop for the step of thinning the base substrate. The use of such SOI substrate as base substrate allows for an accurate control of the thickness of the etched part of the back side of the base substrate.

BRIEF DESCRIPTION OF THE DRAWINGS

The present disclosure may be understood by reference to the following description taken in conjunction with the accompanying figures, in which reference numerals identify features of the present disclosure.

FIGS. 6A-6D show a schematic of the steps of the method for manufacturing a surface acoustic wave tag device according to the present disclosure.

FIGS. 7A-7D show a schematic of the steps of the method for manufacturing a surface acoustic wave tag device according to another embodiment of the present disclosure.

DETAILED DESCRIPTION

Figure 1:
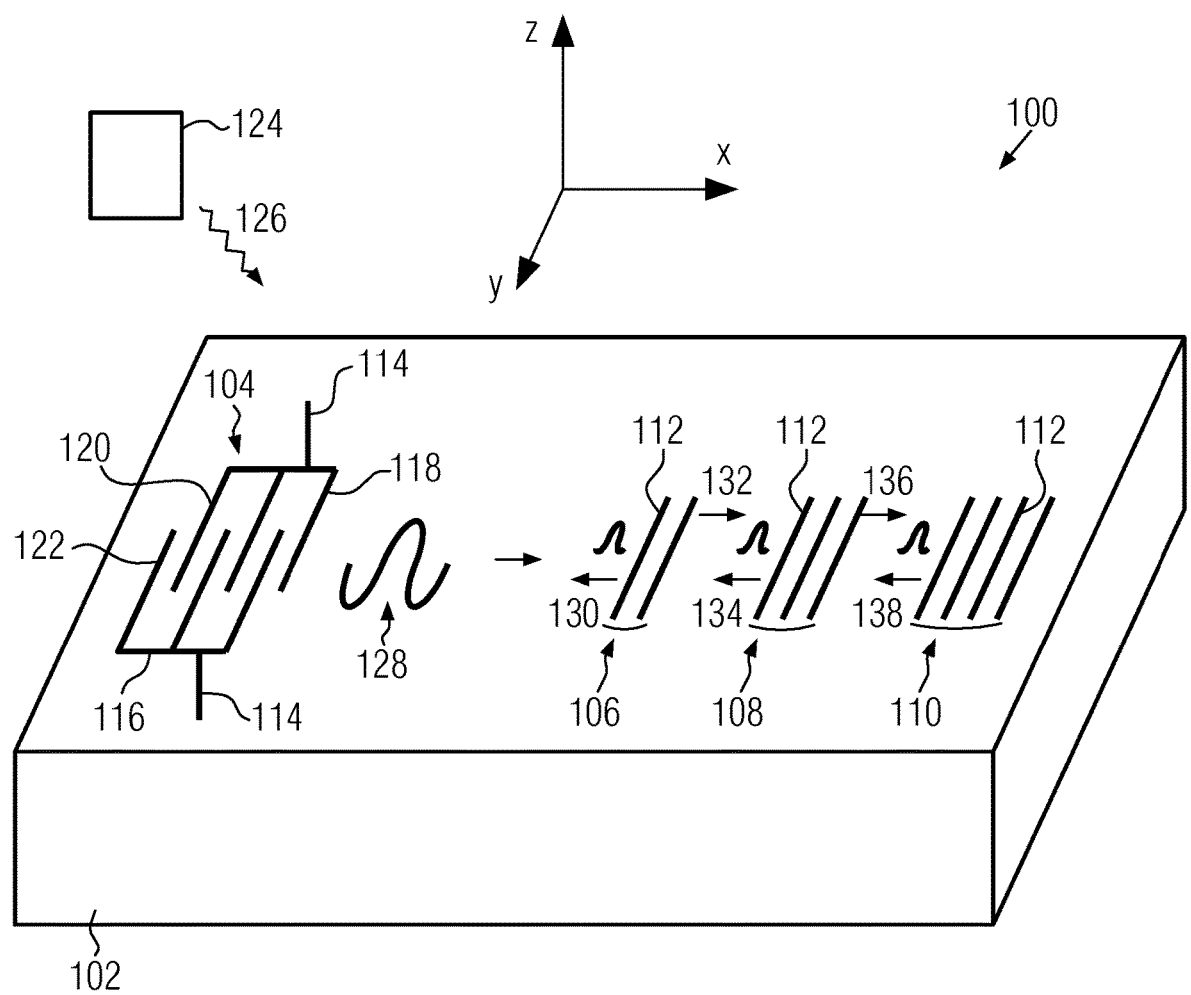
FIG. 1 shows a surface acoustic wave tag device according to the state of the art.

FIG. 1 shows a surface acoustic wave tag device 100 according to the state of the art.

A SAW tag device 100 comprises a substrate 102 with a transducer structure 104 and a set of reflectors 106, 108 and 110, positioned at various delays on one side of the transducer structure 104, in the direction of propagation X as shown in FIG. 1. These reflectors 106, 108 and 110 comprise one or more aluminum strips 112. The SAW tag device also comprises an antenna 114 connected to the transducer structure 104.

The transducer structure 104 comprises two inter-digitated comb electrodes 116 and 118, each comprising a plurality of electrode fingers 120, 122, respectively.

The substrate 102 on which the transducer structure 104 is provided is a piezoelectric bulk material, with crystallographic axis X, Y and Z as shown in FIG. 1. The piezoelectric bulk material of substrate 102 herein described by way of example may be Lithium Niobate LiNbO$_3$, in particular, with a crystal cut (YX/)/128° or YZ.

The principle of operation of a reflector-based SAW tag device 100 is shown schematically in FIG. 1. A distant reader 124 emits an electromagnetic request pulse 126, which is received by the tag antenna 114, directly connected to the transducer structure 104. The transducer structure 104 transforms the electromagnetic request pulse 126 into a surface acoustic Rayleigh wave 128, which propagates along the surface of the substrate 102, along the crystallographic direction X of the piezoelectric material of substrate 102 shown in FIG. 1.

The surface acoustic Rayleigh wave 128 is then partially reflected 130, 134, 138 and partially transmitted 132, 136 by the reflectors 106, 108 and 110, placed at predetermined positions from the transducer structure 104 on the substrate 102. The reflected surface acoustic waves 130, 134 and 138 returning to the transducer structure 104 carry a code based on the positions of the reflectors 106, 108, 110. This encoding method is based on the time delays of reflected pulses. When the reflected surface acoustic waves 130, 134 and 138 return to the transducer structure 104, the acoustic signal is then reconverted into an electrical form and retransmitted by the tag antenna 114. The response signal is then detected and decoded by the reader 124.

SAW tag devices use Rayleigh waves as the surface acoustic waves propagating in the propagation direction of the crystallographic direction X of the piezoelectric material.

SAW tag devices are used as sensors, which can be remotely interrogated, providing a wireless measurement of a physical quantity. Whatever this physical quantity is, it is better to put in place differential measurement to guarantee the measurement of an absolute physical quantity or to suppress correlated external perturbations affecting the sensor.

Due to the sensitivity of SAW sensors to changes in many environmental parameters, it has been customary to utilize some sort of reference signal or signals in the sensors or one or more reference device in the sensor systems.

Due to a thermal drift of several tens of ppm/K for SAW tag devices, when SAW tag devices are used to measure mechanical parameters, such as force, pressure, etc., it is necessary to measure the temperature to subtract this magnitude from the overall measurement made accessible by the SAW tag device.

Figure 2:
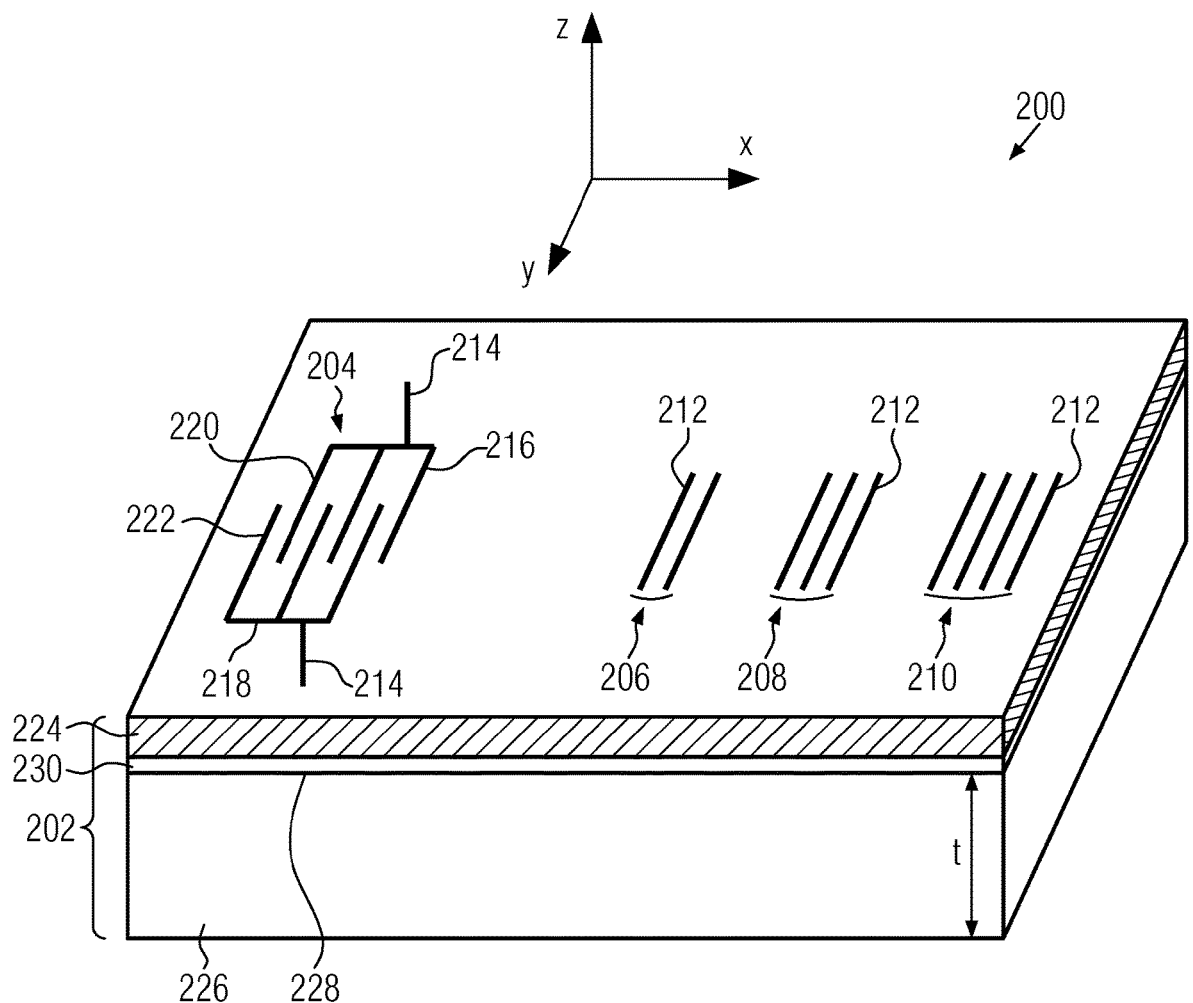
FIG. 2 shows a surface acoustic wave tag device according to a first embodiment of the present disclosure.

FIG. 2 shows a surface acoustic wave tag device according to the present disclosure.

A SAW tag device 200 comprises a substrate 202 with a transducer structure 204, in particular, only one transducer structure, and a set of reflectors 206, 208 and 210, positioned at various delays on one side of the transducer structure 204, in the direction of propagation X as shown in FIG. 2. These reflectors 206, 208 and 210 usually comprise one or more metallic strips 212, e.g., aluminum strips. The SAW tag device 200 also comprises an antenna 214 connected to the transducer structure 204.

In a variant, the reflectors 206, 208 and 210 could also be positioned on either side of the transducer structure 204. In another variant, the set of reflectors comprises more or less reflectors, wherein each one can have more or less metallic strips 212.

In a variant of the invention, the metallic strips 212 of the reflectors can be connected to each other and/or shorted. This results in an improvement of the reflection coefficient of the reflectors at the Bragg condition, in contrary to the state of the art situation of Rayleigh waves on monolithic (YX/)/128° LiNb$_3$. At the Bragg condition, the reflected waves due to electrical and mechanical loading are in phase so that an improved reflection coefficient of the reflector at the Bragg condition results in a better detection of the reflected waves by the transducer structure 204.

The transducer structure 204 comprises two inter-digitated comb electrodes 216 and 218, each comprising a plurality of electrode fingers 220, 222, respectively.

In contrast to the prior art, the substrate 202 on which the transducer structure 204 is provided is a composite substrate. The composite substrate 202 comprises a layer of piezoelectric material 224, with crystallographic axis X, Y and Z, formed on top of a base substrate 226.

The piezoelectric layer 224 in this embodiment is Lithium Niobate LiNbO$_3$, preferably LiNbO$_3$ with a crystal orientation with respect to the base substrate defined according to standard IEEE 1949 Std-176 as (Y X/)/θ, with 0°<θ<100° or with 140°<θ<180° or Lithium Tantalate LiTaO$_3$, preferably LiTaO₃ with a crystal orientation defined with respect to the base substrate according to standard IEEE 1949 Std-176 as (Y X/)/θ, with θ between −30° and 90°. The piezoelectric layer 224 is preferably a single crystal.

The thickness of the piezoelectric layer 224 formed on the base substrate 226 is of the order of one wavelength λ or smaller, in particular, is of about 2 μm or less, in particular, λ/4, even more, in particular, λ/10. Here one wavelength λ is twice the mechanical period of the transducer structure 204, as defined for the Bragg condition. The thickness t of the base substrate 226 must be larger than the thickness of the piezoelectric layer 224 to impose its thermal expansion to the piezoelectric layer 224 and to reduce the transducers sensitivity to temperature changes. A preferred situation corresponds to a base substrate 226 thickness that is at least ten times larger than the thickness of the piezoelectric layer 224, in particular, 50 to 100 times larger, which would correspond to a base substrate thickness equal to 250-500 μm.

The base substrate 226 used in the first embodiment of the present disclosure is a Silicon substrate. The orientation of the Silicon substrate is preferably (100) due to the higher acoustic wave propagation velocity compared to other crystalline orientation, such as, for example, (110), (111) or (001), which can however be used. Since the temperature expansion coefficient of Si is in the vicinity of 2.6 ppm/°C., the combined temperature expansions coefficient of the SAW tag device will be generally within the range of 2.6 ppm/°C. to the temperature expansion coefficient of the piezoelectric material 224 used, depending upon the thickness of the piezoelectric layer 224 and the stress level at the bonding surface 228. The effective lowering of the temperature expansion coefficient of the composite substrate 202 results in a reduced temperature coefficient of frequency (TCF) of the transducer structure 204. It is also advantageous to use a base substrate 226, which exhibits a thermal expansion smaller, up to ten times smaller or even more, than the one of the piezoelectric layer 224, therefore imposing the overall composite thermal expansion and yielding TCF reduction and optimally TCF control as well.

As mentioned previously, by using a different material for the base substrate 226, the flexibility in the design can be enhanced. Instead of Silicon, other substrate materials with a high acoustic wave propagation velocity can be chosen, such as Diamond, Sapphire, Silicon Carbide, Aluminum Nitride, fused Quartz or Quartz crystal and more generally any material presenting a slow shear bulk wave velocity (SSBW velocity) equal or larger than 4500 m/s. The slow shear bulk wave velocity is sensitive to the orientation of the base substrate, for example, for the (111) Silicon, the velocity is about 4500 m/s while for the (100) Silicon, it is about 5700 m/s.

Also, material with smaller thermal expansion than Silicon, i.e., some amorphous quartz compositions or Pyrex glass or Mica or Silicon Carbide for instance, may be advantageously used as base substrate to control the TCF of the resulting device.

In a variant of the present disclosure, the base substrate may further comprise a trap-rich layer close to the top layer of piezoelectric material, the trap-rich layer improving the isolation performance of the base substrate and may be formed by at least one of polycrystalline, amorphous, or porous materials such as for instance polycrystalline Silicon, amorphous Silicon, or porous Silicon, but the present disclosure is not limited to such materials.

In a variant, the base substrate may be a semiconductor on insulator (SOI) substrate. A Silicon on Insulator substrate (SOI) corresponds to a layered silicon-insulator-silicon substrate. The insulating layer can be a SiO₂ layer.

In this embodiment, a thin SiO₂ layer 230 is provided at the surface 228 between the piezoelectric layer 224 and the base substrate 226 to improve the attachment of the piezoelectric material layer 224 to the base substrate 226. The SiO₂ layer 230 is 100 nm thick, but in a variant, the thickness of the SiO₂ layer 230 can vary and be more or less than 100 nm thick, in particular, can vary between 10 nm and 6 μm. The presence of the dielectric SiO₂ layer 230 can modify the electrochemical coupling coefficient $k_s^2$, the temperature stability of the composite substrate 202 as well as the wave phase velocity. This influence depends on the thickness of the layer, for example, increasing the thickness of the SiO₂ layer reduces the wave phase velocity. Therefore, the thickness of the SiO₂ layer 230 represents a parameter to optimize the properties of the composite substrate 202 to obtain the required electrochemical coupling coefficient $k_s^2$ and the temperature stability of the composite substrate 202 and the wave phase velocity for the desired applications of the SAW tag device.

A composite substrate 202 with a combination of strong coupling, starting from 1% to 25% or even more, and temperature stability due to the combination of materials with different temperature coefficient of frequency TCF and high acoustic wave propagation velocity, will enhance the performance of the SAW tag device 200.

Furthermore, in this embodiment, and according to the present disclosure, due to the relative crystalline orientation of the piezoelectric material layer 224 with respect to the base substrate 226, the shear waves are the predominant waves propagating in the crystallographic direction X of the piezoelectric layer 224 and not the Rayleigh waves as in the state of the art SAW tag devices. As the temperature stability of the shear wave on the composite substrate 202 is better than the one of the Rayleigh wave on monolithic (YX/)/128° LiNbO₃, it becomes possible to extend the application of SAW tag devices to the measurement of mechanical parameters, such as force, pressure, etc., in addition to the measurement of the temperature.

Furthermore, the shear wave modes on composite substrate based on LiTaO₃ layers can present stronger electromechanical coupling coefficient $k_s^2$, above 10%, compared to the Rayleigh wave modes on monolithic (YX/)/128° LiNbO₃, having an electromechanical coupling coefficient $k_s^2$ of the order of 5.8%. For example, using a LiTaO₃ (YX/)/42° crystal orientation with respect to the base substrate as piezoelectric material layer, a stronger electromechanical coupling coefficient $k_s^2$ of the order to 11.3% is achieved and will result in an increase by a factor of about 2 of the electromechanical coupling coefficient $k_s^2$. For LiNbO₃-based composite wafers, electromechanical coupling coefficient $k_s^2$ in excess of 20% can be achieved, and therefore an increase in electromechanical coupling by a factor of about 5 can be achieved. This increase in electromechanical coupling will in turn lead to SAW tag devices having an increased distance for remote interrogation.

Finally, the shear wave mode on composite substrate according to this present disclosure propagates at a velocity above or similar to 4000 m/s, about 5 to 10% faster than the Rayleigh wave mode on monolithic (YX/)/128° LiNbO₃, which is favorable from a technological manufacturing point of view as for a given frequency, e.g., 2.45 GHz, the electrode finger width of the SAW tag device will be larger using composite substrate of LiTaO₃/Silicon base substrate rather than monolithic (YX/)/128° LiNbO₃.

Figure 3A:
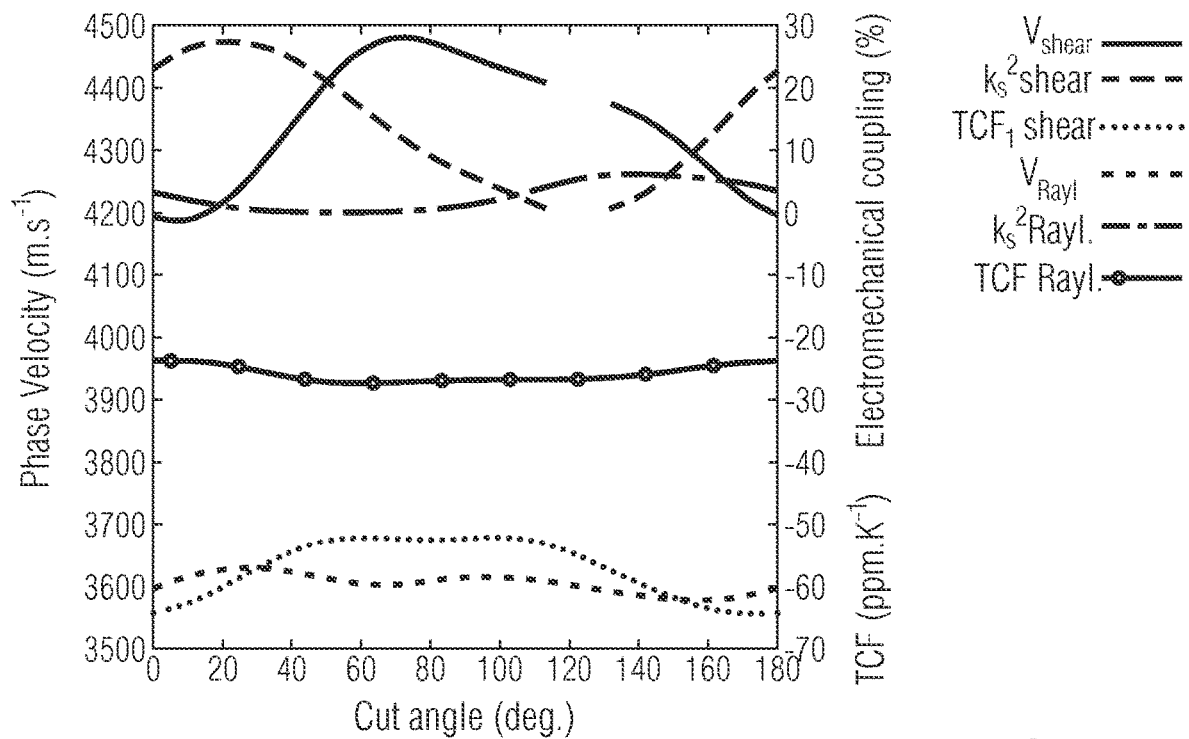
FIGS. 3A and 3B illustrate the characteristics of a surface acoustic wave tag device using a composite substrate according to the present disclosure, with a SiO$_2$ layer of 100 nm in between the piezoelectric layer and the base substrate.
Figure 3B:
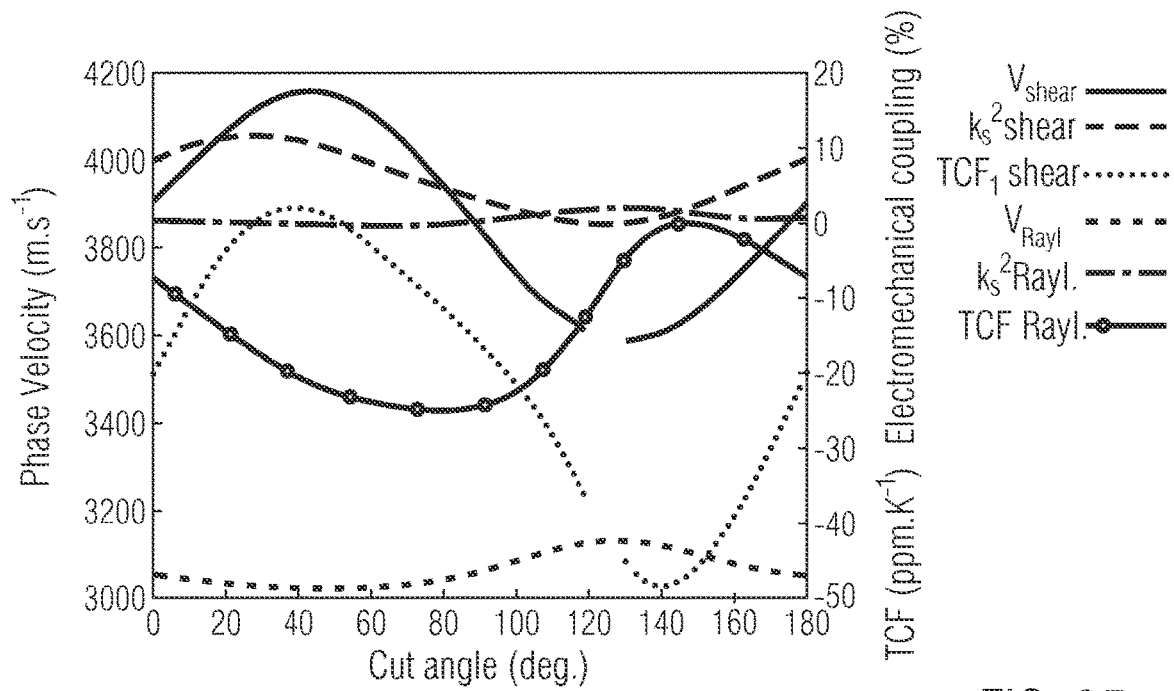

FIGS. 3A and 3B illustrate the dispersion curves for the Rayleigh modes and the pure shear wave modes of a composite substrate with a Silicon base substrate, a 100 nm thick $SiO_2$ dielectric layer and a 500 nm thick piezoelectric layer.

In the case of FIG. 3A, $LiNbO_3$ is used as the piezoelectric material, while for FIG. 3B, $LiTaO_3$ is used. The frequency of operation is 2.45 GHz.

FIGS. 3A and 3B, respectively, plot the phase velocity (m/s) of the guided wave on the left Y axis and the electromechanical coupling coefficient $k_s^2$ (%) and the TCF (ppm/K) value on the right Y axis, as a function of the rotation angle Q of the cut of the piezoelectric layer with respect to the base substrate, on the X axis, for both shear and Rayleigh modes.

As can be seen in FIG. 3A, for Lithium Niobate, virtually all shear modes have electromechanical coupling coefficient $k_s^2$ value suitable for SAW tag device application. A favorable configuration for the use of shear waves with Lithium Niobate corresponds to cutting angles between 0° to 100° or between 140° to 180° in order to take advantage of a maximum absolute value of TCF, being comprised between 50 and 85 ppm/K, i.e., a TCD exceeding 50 ppm/K. Note that for reasons of fundamental symmetry, the properties of the waves are found identically every 180° for the angle θ (rotation around the X axis). Actually, the operation of the SAW tag device should be used for angles θ between 0° and +50°, given the maximum electromechanical coupling coefficient $k_s^2$ for these configurations, being more than 20%.

The use of propagation axis of the shear wave along the X-crystallographic axis direction of the piezoelectric material is preferred as for shear waves the electromechanical coupling coefficient $k_s^2$ is maximized, while for Rayleigh waves no beam-steering effect, being the difference between the wave front direction and the energy direction, will occur in such a configuration. However, other propagation directions remain usable for SAW tag applications provided the corresponding electromechanical coupling coefficient $k_s^2$ is more than 5%, in particular, 3% or more.

As can be seen in FIG. 3B, the Rayleigh modes for Lithium Tantalate do not reach an electromechanical coupling coefficient $k_s^2$ exceeding 3%. On the other hand, with an electromechanical coupling coefficient $k_s^2$ between 3% and 12%, the pure shear wave is exploitable in the angular range -307+90°, modulo 180°.

Furthermore, in the angular range 0° to +90°, absolute values of TCF below 20 ppm/K are achieved, which are values suitable for physical parameter measurements different from temperature, such as pressure and any parameter involving stress combination (torque, acceleration, force, vibration, and so on). These crystal cut configurations seem particularly advantageous for any application not related to the temperature.

It can further be seen that for the (YXlt)/θ cut of Lithium Tantalate, with θ comprised between 20° and 60°, in particular, for 0 equal to 38° and therefore a (YX/)/36° cut, the TCF is close to zero.

Furthermore, it can be seen that the TCF is compatible with the measurement of temperature in the angular range -3070°.

Lithium Tantalate presents furthermore an "adjustable" temperature sensitivity of -50 to +5 ppm/K, a degree of freedom that can be exploited. Lithium Niobate in contrast thereto shows TCFs of more than 50 ppm/K in absolute value.

The fact of being able to access a substrate that is less sensitive or even insensitive to thermal effects makes it possible to measure physical quantities, in particular, mechanical properties, in a simple and efficient way. When the sensor is immune to thermal effects, the interference induced by the thermal variations in the measurement of mechanical properties will be reduced. It will therefore be simpler and more efficient to obtain the measurement of the mechanical properties of interest as when using a SAW sensor according to the state of the art as in FIG. 1.

Figure 4:
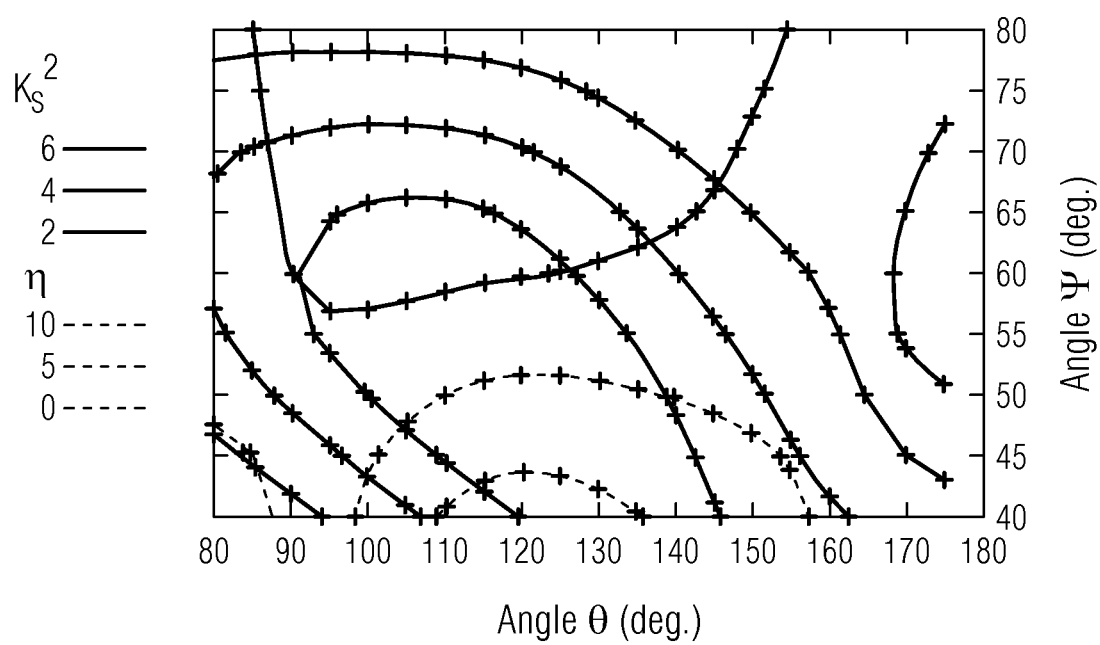
FIG. 4 shows values of the beam steering effect η and the electromechanical coupling coefficient $k_s^2$ plotted as a function of the angle θ of crystal orientation on the X axis and the angle ψ of propagation on the Y axis, for a composite substrate according to the present disclosure.

FIG. 4 shows values of the beam steering effect η and the electromechanical coupling coefficient $k_s^2$ as a function of the angle θ of crystal orientation plotted on the X axis and the angle ψ of propagation plotted on the Y axis, for Lithium Tantalate on $SiO_2$ on Silicon substrate.

For shear waves exhibiting a scalar mechanical displacement field, any propagation direction can be considered. However, as soon as propagating along a crystal direction such as X axis, a beam steering occurs that indicates the mix between shear and sagittal displacement field. Nevertheless, a crystal cut family exists for which an electromechanical coupling factor $k_s^2$ in excess of 3% together with a zero beam-steering angle can be achieved.

According to FIG. 4, this crystal orientation area is defined by (YXwlt)/φ/θ/ψ with φ=0°, 80°<θ<150° and 50°<ψ<80°. In this region, the coupling factor may be in excess of 7.0% with a beam steering angle close or equal to zero.

For shear waves, propagation direction along the X axis can be used to maximize the electromechanical coupling factor $k_s^2$.

Figure 5A:
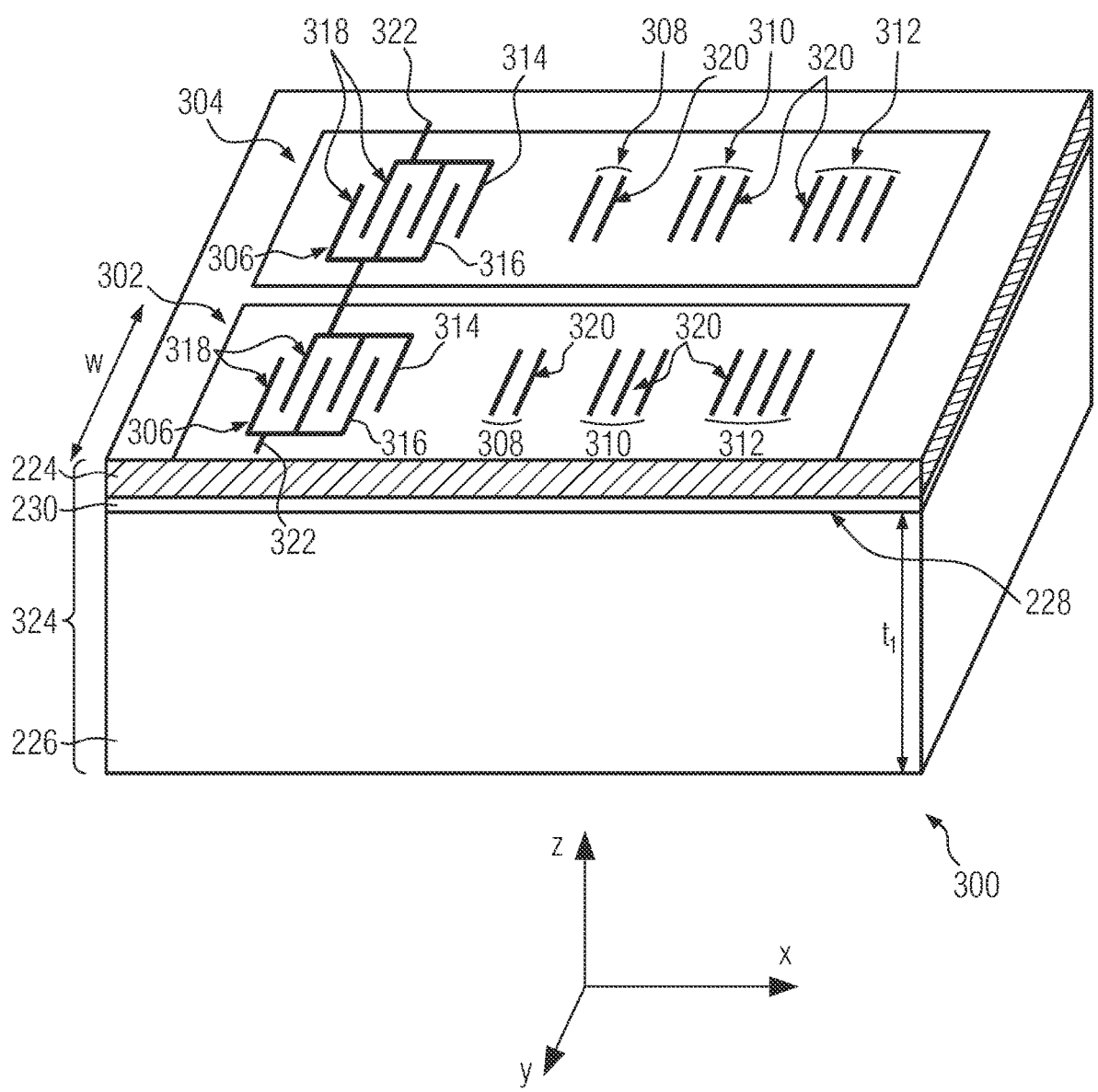
FIG. 5A illustrates a physical quantity determining device comprising two surface acoustic wave tag devices according to a second embodiment of the present disclosure.

FIG. 5A illustrates a physical quantity determining device comprising two surface acoustic wave tag devices according to a second embodiment of the present disclosure.

The physical quantity determining device 300 illustrated in FIG. 5A comprises two surface acoustic wave tag devices 302 and 304 according to the present disclosure. The physical quantity determining device 300 corresponds to a multi-physical sensor, where various physical parameters can be measured, for example, temperature and pressure.

In a variant, the physical quantity determining device 300 can comprise more than two surface acoustic wave tag devices according to the present disclosure.

Each of the two surface acoustic wave tag devices 302 and 304 comprises a transducer structure 306 and a set of reflectors 308, 310 and 312, positioned at various delays on one side of the transducer structure 306 in the direction of propagation X as shown in FIG. 5A. The reflectors 308, 310 and 312 could also be positioned on either side of the transducer structure 306. The transducer structure 306 comprises two inter-digitated comb electrodes 314 and 316, each comprising a plurality of electrode fingers 318. The reflectors 308, 310 and 312 usually comprise one or a few metallic strips 320.

The SAW tag device also comprises an antenna 322 connected to the transducer structure 306. In this embodiment, the antenna 322 actually connects to both transducer structures 306 of the two SAW tag devices 302, 304. According to one aspect of the present disclosure, only one antenna 322 is used independently of how many SAW tag devices 302, 304 are used. According to one other aspect of the present disclosure, each SAW tag device may be coupled to its own antenna to favor the interrogation distance.

In this embodiment, the two surface acoustic wave tag devices 302 and 304 are connected to each other. The connection can either be in series or in parallel. In a variant they can also not be connected to each other.

In this embodiment, the two surface acoustic wave tag devices 302 and 304 have the same structure, meaning that their transducer structure 306, the reflectors 308, 310 and 312 and their design have the same dimensions. In a variant of the embodiment, they can also have different dimensions to adapt to the intended use.

The substrate 324 on which the transducer structure 306 and the reflectors 308, 310 and 312 are provided is the same as the composite substrate 202 of the first embodiment and its features will therefore not be described in detail again, but reference is made to its description above.

In this embodiment, the two surface acoustic wave tag devices 302 and 304 can both be used as sensors to determine a physical quantity, such as the temperature or a mechanical quantity, respectively.

In the physical quantity determining device 300, due to the relative crystalline orientation of the piezoelectric layer 224 with respect to the base substrate 226, the shear waves are the predominant waves propagating in the piezoelectric layer 224. As the temperature stability of the shear wave is better than the one of a Rayleigh surface wave as used in the devices of the prior art, it becomes possible to extend the application of SAW tag devices to the measure of parameters other than temperature, in particular, mechanical parameters, such as force, pressure, etc.

Furthermore, for example, when using shear waves on LiTaO$_3$ (YX/)/42° on a composite substrate, the electromechanical coupling coefficient $k_s^2$ obtained is about 11.3%, which corresponds to a factor of about 2 larger than when Rayleigh waves are used on monolithic (YX/)/128° LiNbO$_3$, where an electromechanical coupling coefficient $k_s^2$ of the order of 5.8% is obtained for these state of the art devices. For LiNbO$_3$ based composite wafers, considering (Y XI)/θ LiNbO$_3$ Cuts with angle θ being defined in the range [0°-50°], electromechanical coupling coefficient $k_s^2$ in excess of 20% can be achieved, corresponding to a factor of about 5 larger than the state of the art devices as described above. This results in the possibility to couple both SAW tag devices to only one antenna, which is at least quite disadvantageous when the above mentioned Rayleigh waves are being used. In fact, in the case of Rayleigh waves, the energy loss would be higher due to a lower coupling coefficient. The design of the physical quantity determining device 300 is therefore simpler and extends its applicability.

Figure 5B:
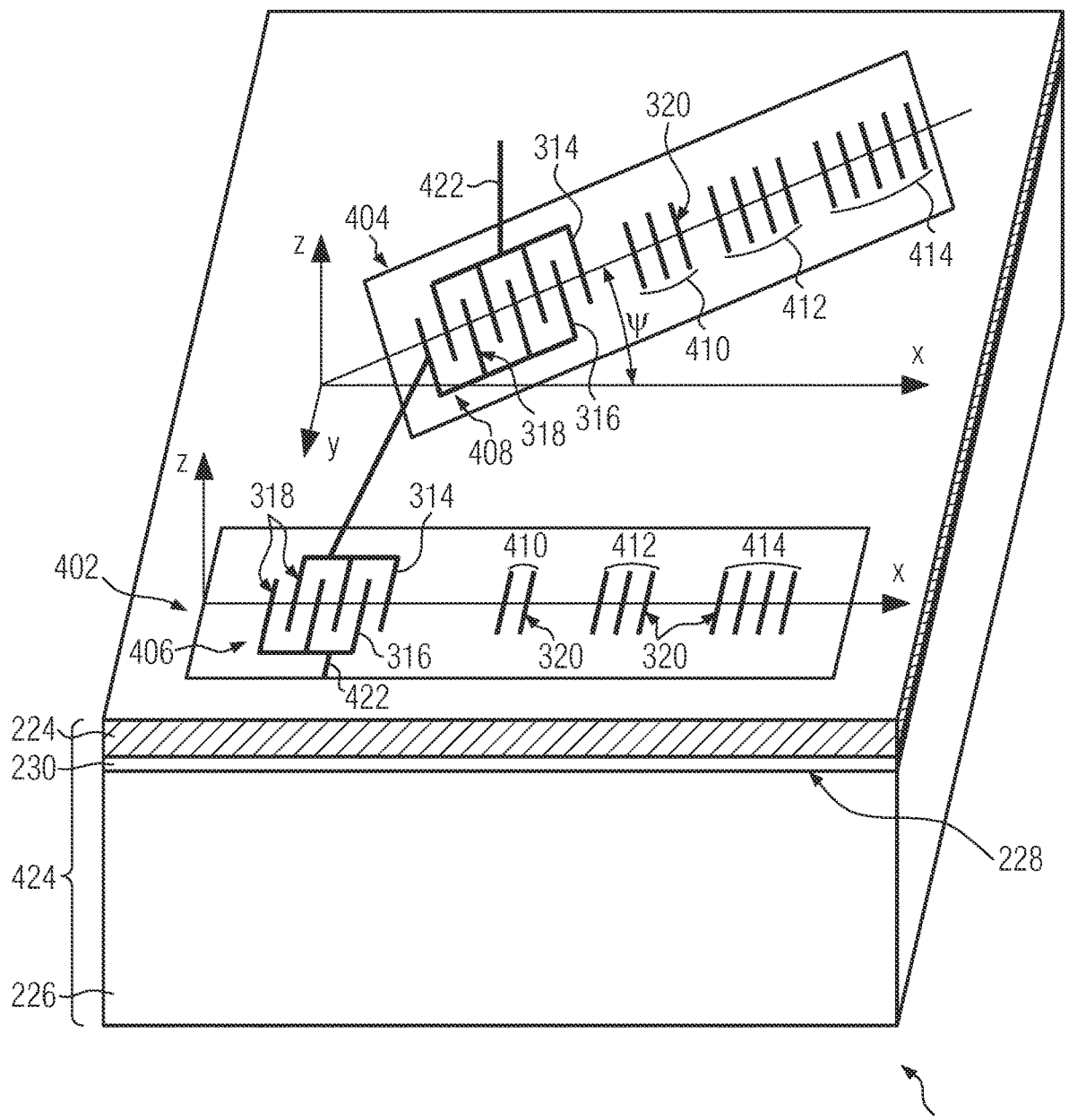
FIG. 5B illustrates a physical quantity determining device according to a third embodiment of the present disclosure, comprising a surface acoustic wave tag device according to the present disclosure and a SAW resonator device.

FIG. 5B illustrates a physical quantity determining device comprising two surface acoustic wave tag devices, with at least one of them according to the present disclosure, according to a third embodiment of the present disclosure.

The physical quantity determining device 400 illustrated in FIG. 5B comprises two surface acoustic wave tag devices 402 and 404 like for the physical quantity determining device 300 of the second embodiment, the difference being that one of the surface acoustic wave tag devices 402 can be used as a sensor and the other surface acoustic wave tag devices 404 can be used for identification. The physical quantity determining device 400 can therefore provide both the identification and the measuring activity using only one substrate 424.

The substrate 424 of the physical quantity determining device 400 is the same as the composite substrate 202 of the first embodiment and its features will therefore not be described in detail again, but reference is made to its description above.

In a variant, the physical quantity determining device 400 can comprise more than two surface acoustic wave tag devices according to the present disclosure, one of them being used for identification and the others as sensors.

The SAW tag device 404 or resonator allows the identification and the SAW tag device 402 allows the measurement of the physical quantity, e.g., temperature. A SAW resonator generally uses the frequency of resonance as measurement parameter, while SAW tag sensors use the time delay of a delay line or compressed signal response as the parameter for indicating a measured quantity.

The SAW tag device 402 and the SAW resonator device 404 may operate at different frequencies, for instance 2.45 GHz for the SAW tag device and 434 or 866 MHz for the SAW resonator device. Both devices can be made on the same base substrate 226 and may use different types of modes, as resonator and delay do not require the same figure of merit by principle. For instance, the SAW tag device 402 may use a shear wave with an electromechanical coupling coefficient $k_s^2$ superior to 6%, whereas the SAW resonator device 404 may use a Rayleigh wave with an electromechanical coupling coefficient ranging from 0.1 to 0.5%. The two SAW tag devices 402, 404 may exploit specific propagation directions, for example, LiTaO$_3$ (YX/)/42° for the SAW tag device 402 and LiTaO$_3$ (YXlt)/42°/90° for the Rayleigh wave for the SAW resonator device 404, as shown in FIG. 4b.

In this embodiment, the SAW tag devices 402 and the SAW resonator device 404 have different structure, meaning that their transducer structure 406, 408, respectively, and the reflectors 410, 412 and 414 have different designs and/or dimensions. In a variant of the embodiment, they can also have the same dimensions and/or design to adapt to the intended use.

In this embodiment, the transducer structures 406, 408 and the reflectors 410, 412 and 414 have the same features, namely inter-digitated comb electrodes 314 and 316, electrode fingers 318 and metallic strips 320, as the transducer structure 306 and the reflectors 310, 312 and 314 of the second embodiment and reference is made to their description above for more details.

In FIG. 5B, the propagation direction of the acoustic wave for the SAW-tag device 402 is along the crystallographic direction X of the piezoelectric layer 224 of the composite substrate 424, while the propagation direction of the acoustic wave for the SAW resonator device 404 is rotated by an angle y compared to the crystallographic direction X of the piezoelectric layer 224. The cut of the piezoelectric layer 224 of the composite substrate 424 would then be defined as (YX/)/θ for the SAW tag device 402 and (YXlt)/θ/ψ for the SAW resonator device 404, according to the standard IEEE 1949 Std-176.

In FIG. 5B, the angle y has a value of 90°, but in a variant of the embodiment, another value of y could be used, depending on the type of acoustic wave generated by the SAW resonator device 404 needed for the application.

In FIG. 5B, an angle y of 90° results in the SAW resonator device 404 using a Rayleigh wave while the SAW tag device 402 uses a shear wave. In a variant of the embodiment, both SAW tag device 402 and resonator 404 device can use the same type of acoustic waves, both being shear waves or being Rayleigh waves or any other type of acoustic waves enabled by the orientation of the piezoelectric layer 224 chosen.

The SAW resonator device 404 being positioned at an angle y of 90° with respect to the SAW tag device 402 means that the transducer structure 406 and the reflectors 410, 412 and 414 of the SAW resonator device 404 are also positioned at an angle v of 90° with respect to the transducer structure 408 and the reflectors 410, 412 and 414 of the SAW resonator device 404.

The SAW tag device 402 and the SAW resonator device 404 are connected to the same antenna 422. In a variant of the embodiment, each SAW tag device 402, 404 can have its own antenna.

The SAW tag device 402 and the SAW resonator device 404 are also connected to each other. The connection will depend on the resonator contribution at high frequencies, assuming the resonator operates at lower frequency than the SAW-tags. The SAW tag device behaves as a pure capacitor for the resonator in this case, then it can be connected either in parallel or in series, but most preferably in series otherwise the capacitance of the SAW tag device, which is by essence much larger than the one of the resonator, will kill the electromechanical coupling of the resonator.

In a variant where each SAW tag device 402, 404 has its own antenna, the SAW tag device 402 and the SAW resonator device 404 can also stand alone as they do not share the same band/frequency operation.

In FIG. 5B, both devices are also made on the same piezoelectric material 224, but in a variant of the embodiment, the SAW tag device 402 can comprise a first piezoelectric material and the SAW resonator device 404 can comprise a second piezoelectric material, both first and second piezoelectric material being on top of the same base substrate 226.

Figure 5C:
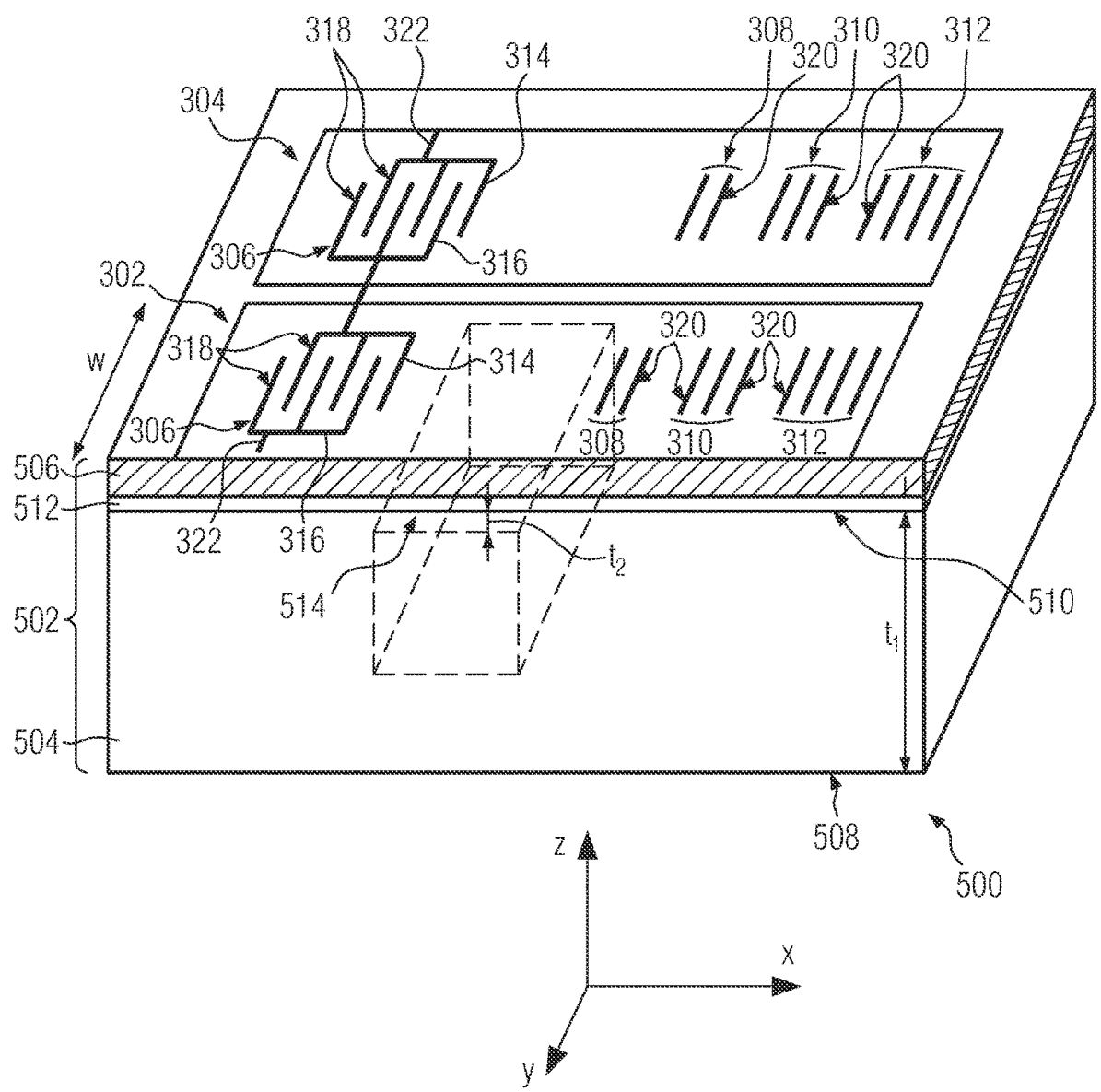
FIG. 5C illustrates a physical quantity determining device comprising two surface acoustic wave tag devices according to a fourth embodiment of the present disclosure.

FIG. 5C illustrates a physical quantity determining device comprising two surface acoustic wave tag devices according to a fourth embodiment of the present disclosure.

The physical quantity determining device 500 illustrated in FIG. 5C comprises two surface acoustic wave tag devices 302 and 304 like for the physical quantity determining device 300 of the second embodiment, and their features will therefore not be described in detail again, but reference is made to its description above.

In a variant, the physical quantity determining device 500 can comprise more than two surface acoustic wave tag devices according to the present disclosure.

The substrate 502 of the physical quantity determining device 500, on which the transducer structure 306 and the reflectors 308, 310 and 312 are provided is the same as the composite substrate 202 of the first embodiment and its features will therefore not be described in detail again, but reference is made to its description above.

The physical quantity determining device 500 differs from the physical quantity determining device 300 of the second embodiment, in that the base substrate 504 of the composite substrate 502 of the physical quantity determining device 500 can be partially thinned so that the base substrate 504 is hollowed out, leaving only a specified thickness of material beneath one of the surface acoustic wave tag device, as illustrated in FIG. 5C, in a side cut view of the physical quantity determining device 500.

Depending on the piezoelectric material 506 and the base substrate 504, the base substrate 504 can be hollowed out by a thinning process of its surface 508, leaving only a thickness $t_2$ of base substrate 504 beneath the SAW tag device 304, as illustrated in FIG. 5C. In FIG. 5C, the surface 508 of the base substrate 504 is the surface opposite the surface 510 where the piezoelectric material 506 is attached to the base substrate 504 via the $SiO_2$ layer 512. This kind of architecture can be used to compensate for temperature variations and thus reduce the sensitivity of the device to temperature.

Furthermore, the fact that the Silicon base substrate 504 can be thinned on its surface 508 enables that a region 514 of the Silicon base substrate 504 can be made deformable, as the resulting thickness of the region 514 of the base substrate 504 can be thin enough to react to vibrations, pressure, etc.

The region 514 is located underneath one of the two surface acoustic wave tag devices 302 or 304 provided on top of the piezoelectric material 506. In FIG. 5C, the thinned region 514 of the base substrate 504 is located underneath the surface acoustic wave tag devices 302 only.

In a variant, the thinned region 514 can also be positioned in the base substrate 504 in between two reflectors, i.e., between 308 and 310, eventually between 310 and 312.

Thus, due to the presence of a thinned region 514 of the base substrate 504 underneath the SAW tag device 302, the SAW tag device 302 can be used to measure mechanical parameters, such as pressure, vibrations, etc. The changes in vibration or pressure of the thinned region 514 in the base substrate 504 will lead in a variation in the time delay of the modes reflected by the reflectors. These variations in the time delay will be detected by the transducer structure of the SAW tag device 302 and will enable to measure the vibration or pressure parameter.

According to a variant, the thinning of the surface of the base substrate can take place underneath each of the SAW tag devices acting as sensor in the physical quantity measuring device. The configuration of the physical quantity measuring device as shown in FIG. 4b can also be used.

FIG. 6 illustrates a schematic of the steps of the method for manufacturing a surface acoustic wave tag device according to the present disclosure, as illustrated in FIG. 5C.

The method comprises a step a) of providing a piezoelectric layer 600 with a thickness t over a base substrate 602 to form a composite substrate 604.

To realize the composite substrate 604 according to the present disclosure, in step a) of the process, a base substrate 602 is provided. The base substrate 602 is a Silicon base substrate, or any other substrate material with high acoustic wave propagation velocity, such as Diamond, Sapphire, Silicon Carbide, Aluminum Nitride, fused Quartz or Quartz crystal.

The piezoelectric layer 600 is either monocrystalline Lithium Niobate ($LiNbO_3$), or Lithium Tantalate ($LiTaO_3$). The thickness t of the piezoelectric layer 600 formed on the base substrate 602 is of the order of the wavelength $\lambda$, in particular, smaller than the wavelength, for example, $\lambda/4$ or even $\lambda/10$, more, in particular, 0.5 µm.

In the composite substrate 602, as illustrated at step a) the piezoelectric layer 600 is provided such that the piezoelectric layer 600 has a crystalline orientation with respect to the base substrate 602 such that the propagation of a shear wave corresponding to the acoustic wave is enabled.

When the piezoelectric material layer 600 is Lithium Niobate $LiNbO_3$, the crystallographic orientation of the piezoelectric material $LiNbO_3$ with respect to the base substrate 602 is (YXl)/$\theta$ according to standard IEEE 1949 Std-176, with $\theta$, an angle of the crystallographic orientation comprised between 0° and 100°, in particular, between 0° and 50°, or between 140° and 180°, modulo 180°.

When Lithium Tantalate $LiTaO_3$ is used as the piezoelectric layer 600, the crystallographic orientation of the piezoelectric material $LiTaO_3$ with respect to the base substrate 602 is (YXl)/$\theta$ according to standard IEEE 1949 Std-176, with $\theta$, an angle of the crystallographic orientation comprised between −30° and 90°, in particular, between 20° and 60°, modulo 180°.

A thin 100 nm $SiO_2$ layer 606 is provided on top of the base substrate 602 prior to providing the piezoelectric layer 600 to improve the attachment. The $SiO_2$ layer may be naturally present on the Si base substrate 602 or may be formed using deposition techniques.

Prior to the attachment, additional processing steps can be added, such as polishing the side of the piezoelectric layer 600 and/or of the surface 608 of the base substrate 602 at which attachment will take place.

The providing of a piezoelectric layer 600 over the base layer 602 can be realized using a layer transfer process, e.g., a SmartCut™ process. During a layer transfer process, a source substrate comprising the to-be-transferred layer is attached, preferably by bonding, to a handle substrate. Following a thermal and/or mechanical treatment a piezoelectric layer 600 is detached at a predetermined splitting zone and thereby transferred onto the handle substrate, here the base substrate 602.

According to step b) a transducer structure 610 is formed on the piezoelectric layer 600, using a combination of layer deposition and patterning steps. As can be seen in FIG. 2, the transducer structure 610 comprises two inter-digitated comb electrodes comprising each a plurality of electrode means 612 and 614, respectively. The inter-digitated comb electrodes and their respective electrode means 612 and 614 are formed of a conductive metal, for example, Aluminum, or Aluminum alloy or Tungsten.

The method also comprises a step of forming a set of reflectors 616, 618 and 620 on the piezoelectric layer 600, using a combination of layer deposition and patterning steps. The reflectors 616, 618 and 620 usually comprise one or more metal strips 622, e.g., Aluminum, and are located on one side of the transducer structure 610, here on the right side in the propagation direction x in FIG. 5. There are positioned at a predetermined distance from the transducer structure 610.

The choice of the layers, their material, their thickness and crystal orientation used for a SAW tag device 624 is made so as to achieve a predetermined electromechanical coupling coefficient $k_s^2$, a predetermined temperature coefficient of frequency TCF and acoustic wave propagation velocity of an acoustic shear wave travelling in the piezoelectric layer 600.

The method also comprises a step of forming an antenna.

As mentioned above more than one SAW tag device can be provided on the piezoelectric layer 600. They can all be manufactured at the same time.

To achieve the embodiment according to FIG. 5, the method further comprises a step c) of thinning the base substrate 602.

According to a variant of the present disclosure, the step c) of thinning the base substrate 602 comprises thinning 626 the surface 628 of the base substrate 602 opposite the surface 608 where the piezoelectric layer 600 is attached to the base substrate 602 via the $SiO_2$ layer 606, over a region 630 defined by the dimension R, located between the transducer structure 610 and the reflectors 616, 618 and 620. The thinning can be achieved by dry etch techniques such as Deep Reactive Ion Etching or wet etch process such as KOH or TMAH etching, grinding or chemical mechanical polishing or any other mechanical process. A mask or protective layer 632 can be used on the surface 628 of the base substrate 602, to delimit the region 630 of dimension R of the base substrate 602 to be etched. This mask or protective layer 632 can then be removed after the step of thinning or at the end of the fabrication process.

As a result of the thinning, illustrated in FIG. 6D, the thickness $t_2$ of the thinned region 636 of the base substrate 602 is smaller than the thickness $t_1$ of the remainder of the base substrate 602 The step of thinning 626 provides a region 636 of the base substrate 602 being deformable, as the resulting thickness $t_2$ of the region 636 of dimension R of the base substrate 602 can be made thin enough to deform under vibrations, pressure, or forces, etc.

As shown in the final surface acoustic wave tag device 638 in FIG. 6D, the thinning step 626 of the surface 628 of the base substrate 602 can take place over a region 636 of dimension R of the surface 628 of the base substrate 602. But it can result in a region 636 of the base substrate 602 of dimension $R_1$, with $R_1$ being smaller or bigger than R, the dimension of the area where the thinning step 626 takes place, with a thickness $t_2$ smaller than $t_1$. A region 636 of the base substrate 602 can have therefore a thickness varying between $t_1$ and $t_2$.

In a variant, the thinned region 636 can also be positioned in the base substrate 602 in between two reflectors, i.e., between 308 and 310, eventually between 618 and 620.

In FIG. 6D, for the final surface acoustic wave tag device 638, the thickness $t_1$ of the base substrate 602 at the periphery is greater than the thickness $t_2$ at the center of the base substrate 602. Thus, the desired temperature stability to make measurements independent of the influence of temperature can still be made, as the remaining material of the base substrate 602 in the region 636 imposes the temperature behavior.

In case of using more than one SAW tag device on the composite substrate 604, the thinning step 626 of the surface 628 of the base substrate 602 can take place underneath each of the SAW tag devices acting as sensors in a physical quantity measuring device, when the physical quantity measuring device comprises at least two SAW tag devices or only some of them.

FIG. 7 illustrates a schematic of the steps of the method for manufacturing a surface acoustic wave tag device according to another embodiment of the present disclosure.

The method is based on the one as illustrated in FIG. 6, but a Silicon on Insulator (SOI) base substrate 704 is used instead of the base substrate 602 for the surface acoustic wave tag device. Thus, the steps illustrated in FIGS. 7A to 7D correspond to the steps illustrated in FIG. 6A to 6D.

The composite substrate 700 comprises a layer of piezoelectric material 702 formed on top of a base substrate 704, the base substrate 704 being a Silicon on Insulator substrate (SOI). A Silicon on Insulator substrate (SOI) corresponds to a layered silicon-insulator-silicon substrate. The insulating layer 706 can be a $SiO_2$ layer. The insulating layer 706 is positioned at a depth d from the surface 708 of the base substrate 704.

A thin 100 nm $SiO_2$ layer 710 is provided on top of the base substrate 704, at the surface 712 prior to providing the piezoelectric layer 702 to improve the attachment. The $SiO_2$ layer may be naturally present on the Si base substrate 704 or may be formed using deposition techniques.

During the step c) of thinning 626 the base substrate 704, the insulating layer 706 may advantageously act as an etch stop, so that the thickness h of the etched base substrate 704 in the region 636 corresponds to the position depth d of the insulating layer 706 in the base substrate 704. The presence of the insulating layer 706 allows to control and achieve the desired membrane thickness $t_2$.

The use of such SOI substrate as base substrate 704 allows for an accurate control of the thickness $t_2$ of a membrane etched into the back side of the Silicon substrate, for the final SAW tag device 718.

According to the present disclosure, a composite substrate 604, 700 can be obtained that provides a predetermined level of electromechanical coupling coefficient $k_s^2$ of at least 3% of up to 20% and more, a propagation velocity of the order of 4000 m/s up to 7000 m/s, and an adjustable temperature stability comprised between −50 to +5 ppm/K can be achieved. For such composite substrates, an increase by a factor of about two up to about five of the electromechanical coupling coefficient $k_s^2$, and therefore an increase in the distance for remotely interrogating the device can be observed using the shear wave modes according to the present disclosure than for devices using the Rayleigh mode. Using such a composite substrate, the design and performance of SAW tag devices as well as their application ranges can be improved compared to bulk piezoelectric substrates.

A number of embodiments of the present disclosure have been described. Nevertheless, it is understood that various modifications and enhancements may be made without departing the following claims.

The invention claimed is:

1. A surface acoustic wave tag device, comprising:
   an acoustic wave propagating substrate comprising a composite substrate including a base substrate and a piezoelectric layer;
   at least one transducer structure comprising inter-digitated comb electrodes disposed over the acoustic wave propagating substrate; and
   a set of reflectors positioned at various delays on one side of the transducer structure in the direction of propagation of an acoustic wave having a wavelength, each reflector comprising a different number of metallic strips, and wherein the metallic strips of each reflector are connected to each other and shorted;
   wherein a crystallographic orientation of the piezoelectric layer with respect to the base substrate is such that the propagation of a shear wave inside the piezoelectric layer and in the direction of propagation corresponding to the acoustic wave is enabled; and
   wherein a thickness of the piezoelectric layer is smaller than the wavelength.

2. The device of claim 1, wherein the piezoelectric layer comprises Lithium Tantalate $LiTaO_3$ or Lithium Niobate $LiNbO_3$.

3. The device of claim 2, wherein:
   the piezoelectric layer comprises Lithium Niobate $LiNbO_3$; and
   the crystallographic orientation of the piezoelectric layer with respect to the base substrate is (YX/)/θ according to standard IEEE 1949 Std-176, with θ, an angle of the crystallographic orientation comprised between 0° and 100°, or between 140° and 180°, modulo 180°.

4. The device of claim 2, wherein:
   the piezoelectric layer comprises Lithium Tantalate $LiTaO_3$; and
   the crystallographic orientation of the piezoelectric layer with respect to the base substrate is (YX/)/θ according to standard IEEE 1949 Std-176 with θ, an angle of the crystallographic orientation comprised between −30° and 90°, modulo 180°.

5. The device of claim 1, wherein the base substrate of the composite substrate comprises at least one material selected from among: Silicon, Diamond, Sapphire, Silicon Carbide, fused Quartz, and Quartz crystal.

6. The device of claim 1, wherein at least a part of the base substrate is deformable.

7. A physical quantity-determining device comprising two or more surface acoustic wave tag devices, at least one of the two or more surface acoustic wave tag devices comprising:
   an acoustic wave propagating substrate comprising a composite substrate including a base substrate and a piezoelectric layer;
   at least one transducer structure comprising inter-digitated comb electrodes disposed over the acoustic wave propagating substrate; and
   a set of reflectors positioned at various delays on one side of the transducer structure in the direction of propagation of an acoustic wave having a wavelength, each reflector comprising a different number of metallic strips, and wherein the metallic strips of each reflector are connected to each other and shorted;
   wherein a crystallographic orientation of the piezoelectric layer with respect to the base substrate is such that the propagation of a shear wave inside the piezoelectric layer and in the direction of propagation corresponding to the acoustic wave is enabled; and
   wherein a thickness of the piezoelectric layer is smaller than the wavelength.

8. The physical quantity-determining device of claim 7, further comprising only one tag antenna connected to the transducer structures of the two or more surface acoustic wave tag devices.

9. The physical quantity-determining device of claim 7, wherein at least another of the two or more surface acoustic wave tag devices is a surface acoustic wave resonator.

10. The physical quantity-determining device of claim 9, wherein the surface acoustic wave resonator is positioned with respect to the at least one of the surface acoustic wave tag devices so that they have two different surface acoustic wave propagation directions.

11. The physical quantity-determining device of claim 9, wherein the surface acoustic wave resonator is positioned with respect to the at least one of the surface acoustic wave tag devices so that its surface acoustic wave propagation direction, being parallel to one of a crystalline axis of the piezoelectric layer makes an angle Y with the surface acoustic wave propagation direction of the at least one of the surface acoustic wave tag devices.

12. The physical quantity-determining device of claim 9, wherein the surface acoustic wave resonator is configured to use Rayleigh waves and the at least one of the surface acoustic wave tag devices is configured to use shear waves.

13. The physical quantity-determining device according to claim 7, wherein the physical quantity-determining device is configured to measure temperature and/or pressure and/or forces and/or configured to allow for identification.

* * * * *

UNITED STATES PATENT AND TRADEMARK OFFICE
CERTIFICATE OF CORRECTION

| | |
|---|---|
| PATENT NO. | : 12,271,774 B2 |
| APPLICATION NO. | : 16/980324 |
| DATED | : April 8, 2025 |
| INVENTOR(S) | : Sylvain Ballandras and Thierry LaRoche |

It is certified that error appears in the above-identified patent and that said Letters Patent is hereby corrected as shown below:

In the Specification

| | | |
|---|---|---|
| Column 2, | Line 66, | change "below-20 ppm/K" to --below -20 ppm/K-- |
| Column 2, | Line 67, | change "range of 0" to --range of θ-- |
| Column 3, | Line 1, | change "for 0 of" to --for θ of-- |
| Column 6, | Line 45, | change "the invention, the" to --the present disclosure, the-- |
| Column 6, | Line 50, | change "(YX/)/128° LiNb$_3$. At" to --(YX/)/128° LiNbO$_3$. At-- |
| Column 6, | Line 66, | change "with 0°<0<100° or" to --with 0°<θ<100° or-- |
| Column 6, | Line 67, | change "140°<0<180° or" to --140°<θ<180° or-- |
| Column 9, | Line 45, | change "range-307+90°," to --range -30°/+90°,-- |
| Column 9, | Line 56, | change "for 0 equal" to --for θ equal-- |
| Column 9, | Lines 59-60, | change "range -3070°." to --range -30°/0°.-- |
| Column 11, | Line 33, | change "[0°-50°]," to --[0° - 50°],-- |
| Column 12, | Line 19, | change "(YX/)/42° for" to --(YX$l$)/42° for-- |
| Column 12, | Line 39, | change "the SAW-tag device" to --the SAW tag device-- |
| Column 12, | Line 49, | change "angle y has" to --angle ψ has-- |
| Column 12, | Line 50, | change "value of y could be" to --value of ψ could be-- |
| Column 12, | Line 53, | change "angle y of 90°" to --angle ψ of 90°-- |
| Column 12, | Line 62, | change "angle y of 90°" to --angle ψ of 90°-- |
| Column 12, | Line 65, | change "angle v of 90°" to --angle ψ of 90°-- |

In the Claims
| | | | |
|---|---|---|---|
| Claim 11, | Column 17, | Line 46, | change "an angle Y with the" to --an angle ψ with the-- |

Signed and Sealed this
Seventeenth Day of June, 2025

Coke Morgan Stewart
*Acting Director of the United States Patent and Trademark Office*